US011956988B2

(12) United States Patent
Jiang et al.

(10) Patent No.: US 11,956,988 B2
(45) Date of Patent: *Apr. 9, 2024

(54) DISPLAY SUBSTRATE AND METHOD FOR MANUFACTURING SAME, AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Zhiliang Jiang, Beijing (CN); Pan Zhao, Beijing (CN)

(73) Assignees: CHENGDU BOE OPTOELECTRONICS TECHNOLOGY CO. LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/952,845

(22) Filed: Sep. 26, 2022

(65) Prior Publication Data

US 2023/0016921 A1 Jan. 19, 2023

Related U.S. Application Data

(63) Continuation of application No. 16/958,949, filed as application No. PCT/CN2019/091354 on Jun. 14, 2019, now Pat. No. 11,495,772.

(51) Int. Cl.
*H01L 51/52* (2006.01)
*H01L 23/00* (2006.01)
(Continued)

(52) U.S. Cl.
CPC ....... *H10K 50/8426* (2023.02); *H01L 23/562* (2013.01); *H10K 50/844* (2023.02);
(Continued)

(58) Field of Classification Search
CPC ............... H01L 23/562; H01L 51/5246; H01L 51/5253; H01L 27/3258; H10K 50/8426;
(Continued)

(56) References Cited

U.S. PATENT DOCUMENTS 10,439,163 B2 10/2019 Su et al.
11,094,911 B2 8/2021 Wu
(Continued)

FOREIGN PATENT DOCUMENTS

CN 102255056 A * 11/2011 ............. H01L 51/52
CN 102255056 A 11/2011
(Continued)

OTHER PUBLICATIONS

Machine translation, Han, Korean Pat. Pub. No. KR2017-0128683A, translation date: Jul. 11, 2023, Espacenet, all pages. (Year: 2023).*

(Continued)

*Primary Examiner* — Victoria K. Hall
(74) *Attorney, Agent, or Firm* — Lippes Mathias LLP

(57) ABSTRACT

A display substrate including: a base substrate with a display region, an encapsulation region and an edge region on a periphery of the encapsulation region, the edge region includes a bonding region on at least one side of the base substrate; a plurality of stacked inorganic film layers on a side of the base substrate; a plurality of first grooves, at the edge region, spaced apart from each other in a direction distal from the encapsulation region, and extending along a periphery of the base substrate, at least one of the plurality of first groove runs through at least one inorganic film layer of the plurality of inorganic film layers, and a distance between each first groove and the display region is larger than that between each first groove and an edge of the base substrate; and an organic layer.

19 Claims, 9 Drawing Sheets

(51) Int. Cl.

| | |
|---|---|
| ***H01L 27/32*** | (2006.01) |
| ***H01L 51/56*** | (2006.01) |
| ***H10K 50/842*** | (2023.01) |
| ***H10K 50/844*** | (2023.01) |
| ***H10K 59/124*** | (2023.01) |
| ***H10K 71/00*** | (2023.01) |
| *H10K 59/12* | (2023.01) |

(52) U.S. Cl.
CPC ........... *H10K 59/124* (2023.02); *H10K 71/00* (2023.02); *H10K 59/1201* (2023.02)

(58) Field of Classification Search
CPC ............. H10K 50/844; H10K 59/8722; H10K 59/873; H10K 59/124
See application file for complete search history.

(56) References Cited

U.S. PATENT DOCUMENTS

| | | | | |
|---|---|---|---|---|
| 11,342,532 | B2 | 5/2022 | Liu et al. | |
| 11,394,009 | B2 * | 7/2022 | Xiao | H10K 59/124 |
| 11,495,772 | B2 * | 11/2022 | Jiang | H10K 50/844 |
| 11,778,853 | B2 * | 10/2023 | Liu | H10K 59/40 257/86 |
| 2004/0263740 | A1 | 12/2004 | Sakakura et al. | |
| 2006/0087229 | A1 | 4/2006 | Kim | |
| 2015/0028307 | A1 | 1/2015 | Kim et al. | |
| 2015/0221708 | A1 | 8/2015 | Go et al. | |
| 2016/0035997 | A1 | 2/2016 | Oh | |
| 2016/0260928 | A1 | 9/2016 | Choi et al. | |
| 2017/0012243 | A1 | 1/2017 | Suzuki et al. | |
| 2018/0061910 | A1 | 3/2018 | Cai | |
| 2018/0095571 | A1 * | 4/2018 | Park | H10K 50/805 |
| 2019/0058021 | A1 | 2/2019 | Kim | |
| 2019/0058154 | A1 | 2/2019 | Suzuki et al. | |
| 2019/0058159 | A1 | 2/2019 | Furuie | |
| 2019/0214598 | A1 | 7/2019 | Harada | |
| 2019/0288233 | A1 | 9/2019 | Suzuki et al. | |
| 2019/0326375 | A1 | 10/2019 | Ochi et al. | |
| 2019/0363275 | A1 | 11/2019 | Ochi et al. | |
| 2019/0363284 | A1 | 11/2019 | Yasuda et al. | |
| 2020/0111857 | A1 | 4/2020 | Moon et al. | |
| 2020/0127220 | A1 | 4/2020 | Kim et al. | |
| 2020/0328376 | A1 | 10/2020 | Seo et al. | |
| 2021/0028393 | A1 | 1/2021 | Wang et al. | |
| 2021/0288286 | A1 | 9/2021 | Okabe et al. | |
| 2021/0336205 | A1 | 10/2021 | Wang et al. | |
| 2021/0336208 | A1 | 10/2021 | Liu et al. | |
| 2021/0367170 | A1 | 11/2021 | Song et al. | |

FOREIGN PATENT DOCUMENTS

| | | | | | |
|---|---|---|---|---|---|
| CN | 107068715 | A | | 8/2017 | |
| CN | 107195794 | A | | 9/2017 | |
| CN | 108010921 | A | * | 5/2018 | H01L 27/1248 |
| CN | 108010921 | A | | 5/2018 | |
| CN | 108520895 | A | * | 9/2018 | H10K 50/844 |
| CN | 108520895 | A | | 9/2018 | |
| CN | 108598287 | A | * | 9/2018 | H10K 50/8445 |
| CN | 108598287 | A | | 9/2018 | |
| CN | 109103234 | A | | 12/2018 | |
| CN | 109801953 | A | * | 5/2019 | H01L 27/32 |
| CN | 109801953 | A | | 5/2019 | |
| KR | 10-2017-0128683 | A | * | 11/2017 | G02F 1/133305 |
| KR | 20170128683 | A | | 11/2017 | |
| WO | 2018179308 | A1 | | 10/2018 | |

OTHER PUBLICATIONS

Machine translation, Li, Chinese Pat. Pub. No. CN102255056A, translation date: Jul. 11, 2023, Espacenet, all pages. (Year: 2023).*
Machine translation, Wang, Chinese Pat. Pub. No. CN108520895A, translation date: Jul. 11, 2023, Espacenet, all pages. (Year: 2023).*
Machine translation, Jiang, Chinese Pat. Pub. No. CN108010921A, translation date: Jul. 11, 2023, Espacenet, all pages. (Year: 2023).*
Machine translation, Zhang, Chinese Pat. Pub. No. CN109801953A, translation date: Jul. 11, 2023, Espacenet, all pages. (Year: 2023).*
Machine translation, Yu, Chinese Pat. Pub. No. CN108598287A, translation date: Jul. 11, 2023, Espacenet, all pages. (Year: 2023).*
Extended European search report of counterpart European application No. 19932902.0 dated Nov. 29, 2022.
International search report of PCT application No. PCT/CN2019/091354 dated Mar. 12, 2020.
Non-final office Action of U.S. Appl. No. 16/958,949 dated Jan. 6, 2022.
Final office Action of U.S. Appl. No. 16/958,949 dated Apr. 22, 2022.
Notice of allowance of U.S. Appl. No. 16/958,949 dated Jul. 1, 2022.

* cited by examiner

DISPLAY SUBSTRATE AND METHOD FOR MANUFACTURING SAME, AND DISPLAY DEVICE

CROSS-REFERENCE TO RELATED APPLICATION

This application is a continuation application of U.S. application Ser. No. 16/958,949, filed on Jun. 29, 2020, now U.S. Pat. No. 11,495,772, issued Nov. 8, 2022, which is a 371 of Application PCT/CN2019/091354 filed on Jun. 14, 2019, the entire contents of which are incorporated herein by reference.

TECHNICAL FIELD

The present disclosure relates to the field of display technologies, and more particularly, relates to a display substrate and a method for manufacturing the same, and a display device.

BACKGROUND

An active matrix organic light emitting diode (AMOLED) display substrate is widely applied in the current field of display due to advantages of small thickness, self-light emission, high contrast, wide color gamut, bendability and manufacturability on a flexible base substrate.

SUMMARY

In one aspect, a display substrate is provided. The display substrate includes:

a base substrate with a display region, an encapsulation region and an edge region on a periphery of the encapsulation region, wherein the edge region includes a bonding region on at least one side of the base substrate;

a plurality of stacked inorganic film layers on a side of the base substrate;

a plurality of first grooves, at the edge region, spaced apart from each other in a direction distal from the encapsulation region and extending along a periphery of the base substrate, wherein at least one of the plurality of first grooves runs through at least one inorganic film layer of the plurality of inorganic film layers, and orthographic projections of the plurality of first grooves on the base substrate have a non-overlapping region with the bonding region, and a distance between at least one of the plurality of first grooves and the display region is larger than a distance between at least one of the plurality of first grooves and an edge of the base substrate; and an organic layer, covering at least one of the plurality of first grooves.

In another aspect, a method for manufacturing a display substrate is provided. The method includes:

providing a base substrate, wherein the base substrate is provided with a display region, an encapsulation region and an edge region at the periphery of the encapsulation region, the edge region including a bonding region disposed on at least one side of the base substrate;

forming a plurality of stacked inorganic film layers on a side of the base substrate from an inorganic material;

forming a plurality of first grooves which are spaced apart from each other and extend along a periphery of the base substrate on the edge region in a direction distal from the encapsulation region, wherein at least one of the plurality of first grooves runs through at least one inorganic film layer of the plurality of inorganic film layers, and orthographic projections of the plurality of first grooves on the base substrate have a non-overlapping region with the bonding region, and a distance between at least one of the plurality of first grooves and the display region is larger than a distance between at least one of the plurality of first grooves and an edge of the base substrate; and forming an organic layer covering at least one of the plurality of first grooves from an organic material.

In yet another aspect, a display device is provided. The display device includes the display substrate according to the aforesaid aspects.

BRIEF DESCRIPTION OF THE DRAWINGS

In order to describe the technical solutions in the embodiments of the present more clearly, the following briefly introduces the accompanying drawings required for describing the embodiments. Apparently, the accompanying drawings in the following description show merely some embodiments of the present disclosure, and a person of ordinary skill in the art may also derive other drawings from these accompanying drawings without creative efforts.

DETAILED DESCRIPTION

Due to poor impact resistance of the AMOLED display substrate, the edge of the AMOLED display substrate is easily subject to cracks in the process of manufacturing or transportation. The AMOLED display substrate is made of an organic light emitting material which has high sensitivity on moisture or oxygen. Therefore, when the crack extends to a display region of the AMOLED display substrate, moisture or oxygen in the air is likely to enter the display region through the crack. Consequently, black spots are caused on the display substrate and the quality of the display substrate is affected.

The present disclosure are described hereinafter in further detail with reference to the accompanying drawings, to present the objects, technical solutions, and advantages of the present disclosure more clearly.

Figure 1:
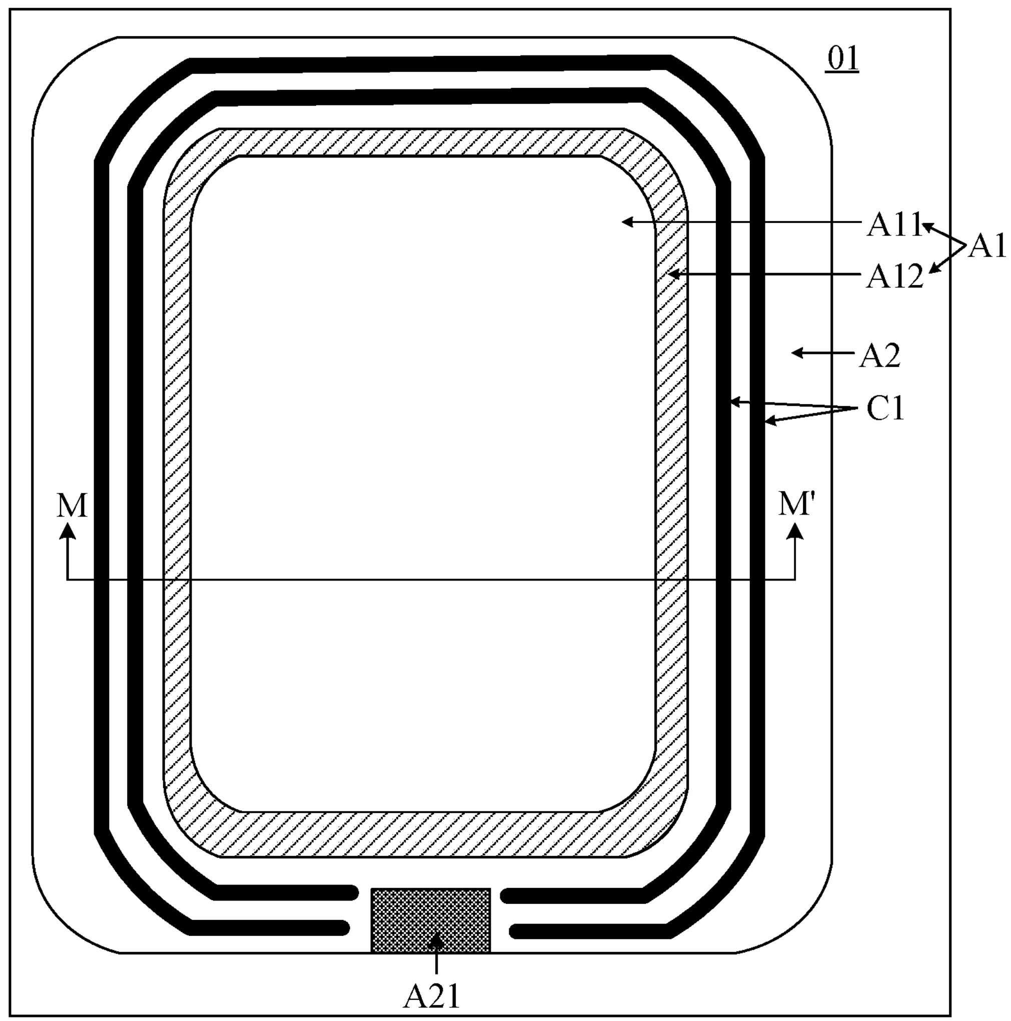
FIG. 1 is a top view of a display substrate according to an embodiment of the present disclosure.
Figure 2:
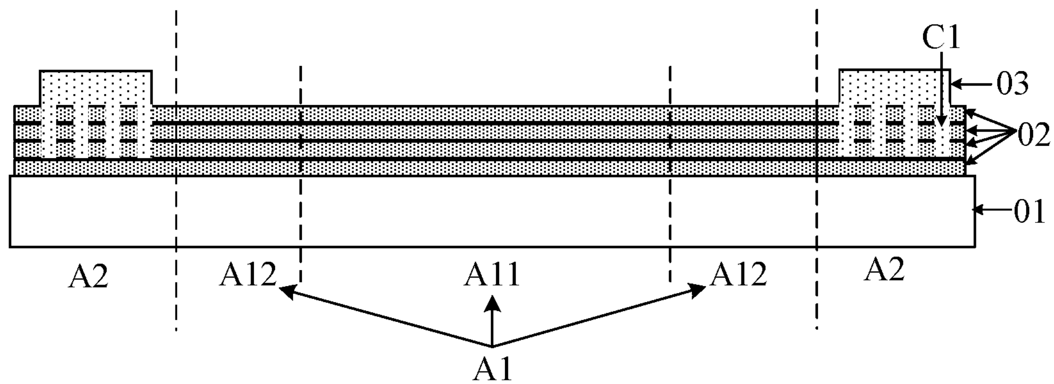
FIG. 2 is a sectional view of a display substrate according to an embodiment of the present disclosure.

FIG. 1 is a top view of a display substrate according to an embodiment of the present disclosure. FIG. 2 is a sectional view of a display substrate shown in FIG. 1 in an MM' direction. As shown in FIG. 1 and FIG. 2, the display substrate may include: a base substrate 01, a plurality of inorganic film layers 02, a plurality of first grooves C1, and an organic layer 03. The inorganic film layer 02 may be made of an inorganic material, and the organic layer 03 may be made of an organic material.

Referring to FIG. 1 and FIG. 2, the base substrate 01 may include an encapsulation region A1 and an edge region A2 disposed on a periphery of the encapsulation region A1. The edge region A2 includes a bonding region A21 disposed on the side, where at least one side of the base substrate 01 is disposed, for example, FIG. 1 only shows the bonding region A21 on the side where one side is disposed.

The plurality of inorganic film layers 02 may be disposed on a side of the base substrate 01 and are arranged in a stacking fashion, for example, FIG. 2 only shows four inorganic film layers disposed on a side of the base substrate 01 and arranged in a stacking fashion.

The plurality of first grooves C1 may be disposed in the edge region A2 and sequentially spaced apart from each other in a direction distal from the encapsulation region A1, and extend along a periphery of the base substrate 01. For example, FIG. 2 shows four first grooves C1 extending along the periphery of the base substrate 01, and FIG. 1 shows a top view of two first grooves C1.

Each first groove C1 may run through at least one inorganic film layer 02 of the plurality of inorganic film layers 02, and orthographic projections of the plurality of first grooves C1 do not overlap the bonding region A21. The organic layer 03 may cover the plurality of first grooves C1.

The plurality of first grooves C1 are disposed in the edge region A2 and a gap exists between the first grooves C1 and the encapsulation region A1. Therefore, the plurality of first grooves C1 may block the crack on the edge of the display substrate to prevent the crack from extending to the encapsulation region A1. The plurality of first grooves C1 may block extension of the crack. Therefore, the inorganic film layer between the two adjacent first grooves C1 may form a barrier portion, which may also be referred to as a crack dam.

Referring to FIG. 1 and FIG. 2, the base substrate 01 may further include a display region A11, and the encapsulation region may include a display region A11 and a peripheral region A12 surrounding the display region A11. That is, referring to FIG. 2, the display region A11 may further cover the plurality of inorganic film layers 02. The edge region A2 may be an annular region surrounding the encapsulation region A1. Moreover, the bonding region A21 may be disposed on a side, proximal to a flexible printed circuit board (FPC) or a chip on film (COF), of the edge region A2.

A distance between each first groove C1 and the display region A11 is larger than a distance between each first groove and an edge of the base substrate 01. The distance between the first groove C1 and the display region A11 refers to a distance between the first groove C1 and a first target side, close to the first groove C1, of four sides of the display region A11. The distance between the first groove C1 and the edge of the base substrate 01 refers to a distance between the first groove C1 and a second target side, close to the first groove C1, of four sides of the base substrate 01. An extending direction of the first target side and second target side are parallel to that of the first groove C1. In this manner, the crack dam can be further prevented from extending to the display region and thus ensure the quality of the display substrate.

In conclusion, the embodiment of the present disclosure provides a display substrate. An edge region of the base substrate not only includes a plurality of first grooves running through at least one inorganic film layer, but also includes an organic layer covering the plurality of first grooves, wherein a hardness of an organic material for forming the organic layer is greater than a hardness of an inorganic material for forming the inorganic film layer. Therefore, the impact resistance of the display substrate is effectively improved by soft and hard matching, an external force on the display substrate is buffered, the problem of encapsulation failure caused by extension of the crack to the encapsulation region may be effectively addressed, and the quality of the display substrate may be enhanced. Furthermore, by making the orthographic projections of the plurality of first grooves on the base substrate not overlap the bonding region, a metal wire disposed in the bonding region may be prevented from being exposed and corroded when the first grooves are formed by an etching process, thereby ensuring the yield of the display substrate.

In the embodiment of the present disclosure, an orthographic projection of the organic layer 03 on the base substrate 01 also may not overlap the bonding region A21. Accordingly, the problem that the metal wire disposed in the bonding region may not be bonded normally because the organic layer covers the bonding pad disposed in the bonding region may be addressed.

In the embodiment of the present disclosure, the plurality of stacked inorganic film layers may cover the encapsulation region A1 and the edge region A2. Exemplarily, a plurality of stacked inorganic film layers covering the encapsulation region A1 and the edge region A2 may be formed on the base substrate 01 before a plurality of first grooves C1 are formed. Then, a part, disposed in the edge region A2, of at least one inorganic film layer may be etched to obtain the plurality of first grooves C1.

Figure 3:
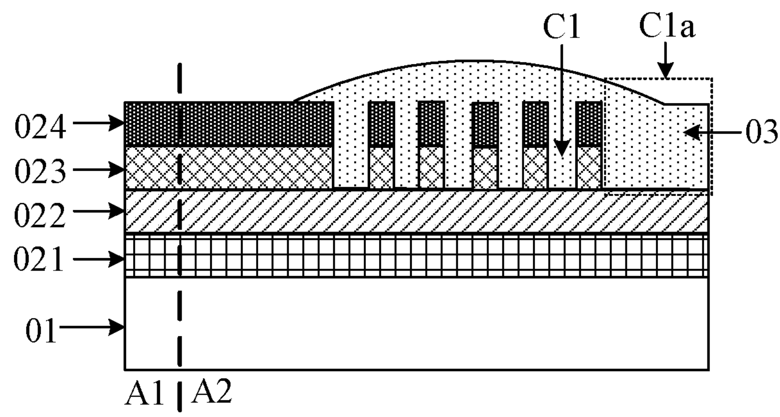
FIG. 3 is a sectional view of another display substrate according to an embodiment of the present disclosure.

FIG. 3 is a sectional view of another display substrate according to an embodiment of the present disclosure. As shown in FIG. 3, the display substrate includes: four inorganic film layers 02 disposed on a side of the base substrate 01, wherein the four inorganic film layers may include a barrier layer 021, a buffer layer 022, a gate insulator (GI) layer 023, and an interlevel dielectric (ILD) layer 024 which are sequentially stacked along a direction distal from the base substrate 01. The barrier layer 021 made of an inorganic material is formed on a side distal from the base substrate 01 firstly and may effectively prevent moisture or oxygen from entering the base substrate 01, such that the moisture blocking, oxygen blocking and the scraping resistance of the base substrate 01 are improved.

As an optional implementation, referring to FIG. 3, in the plurality of inorganic film layers 02, at least one inorganic film layer which each first groove C1 runs through may include a gate insulator layer 023 and an interlevel dielectric layer 024 which are sequentially stacked in a direction distal from the base substrate 01. That is, each first groove C1 may only penetrate through the gate insulator layer 023 and the interlevel dielectric layer 024.

Accordingly, referring to FIG. 3, a barrier portion formed between the two adjacent first grooves C1 may be formed by the gate insulator layer and the interlevel dielectric layer which are sequentially stacked. A gate insulator layer pattern is disposed in the gate insulator layer 023 and an interlevel dielectric layer pattern is disposed in the interlevel dielectric layer 024.

Figure 4:
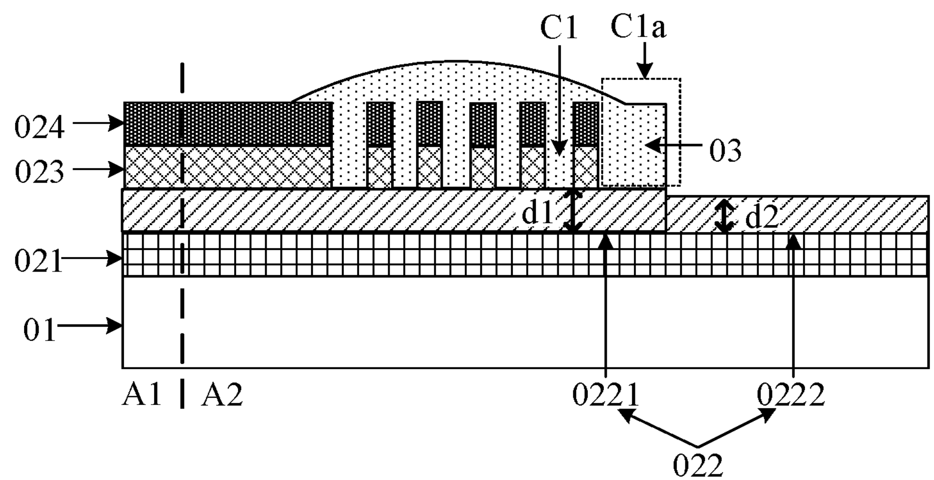
FIG. 4 is a sectional view of another display substrate according to an embodiment of the present disclosure.
Figure 5:
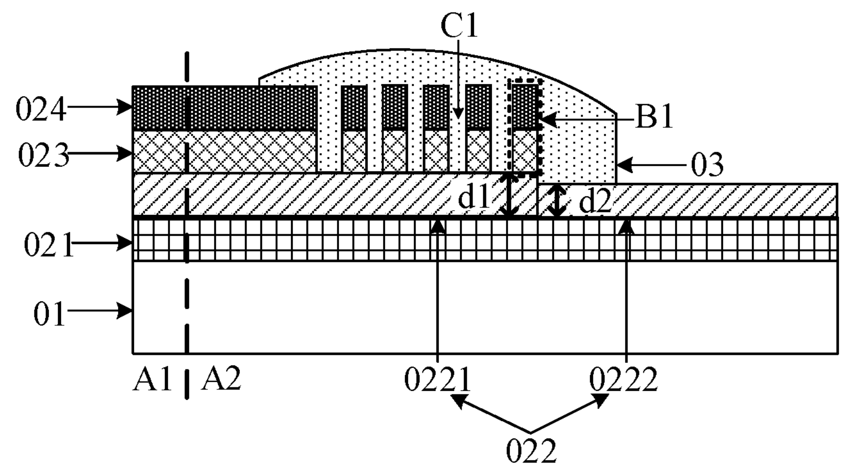
FIG. 5 is a sectional view of another display substrate according to an embodiment of the present disclosure.

Further, referring to FIGS. 4 and 5, in the embodiment of the present disclosure, the plurality of inorganic film layers 02 may further include: a buffer layer 022 disposed between the base substrate 01 and the at least one inorganic film layer 02. The buffer layer 022 may include a first buffer pattern 0221 and a second buffer pattern 0222.

Referring to FIGS. 4 and 5, it can be seen that an orthographic projection of the first buffer pattern 0221 on the substrate base 01 covers the encapsulation region A1 and a part of the edge region A2, and the second buffer pattern 0222 is disposed in the edge region A2, that is, the second buffer pattern 0222 is close to the edge of the base substrate 01 relative to the first buffer pattern 0221, and a thickness d1 of the first buffer pattern 0221 is greater than a thickness d2 of the second buffer patter 0222. A direction of the thickness of the first buffer pattern 0221 and a direction of the thickness of the second buffer pattern 0222 are both vertical to a bearing surface of the base substrate 01. The bearing surface of the base substrate 01 refers to a surface, which is provided with a film structure (for example, inorganic film layer) of a plurality of surfaces of the base substrate 01.

Please refer to FIG. 4. An orthographic projection of the organic layer 03 on the buffer layer 022 partially overlaps the second buffer pattern 0222. Furthermore, an orthographic projection of a side, away from the encapsulation region A1, of the first groove C1*a* (namely the first groove C1*a* on the outermost side), most distal from the encapsulation region A1, of the plurality of first grooves C1 on the buffer layer 022 overlaps a border line of the first buffer pattern 0221 and the second buffer pattern 0222.

Please refer to FIG. 5. The inorganic film layer between each two of adjacent first grooves C1 may form a barrier portion. Therefore, as shown in FIG. 5, an orthographic projection of a side, distal from the encapsulation region A1, of the barrier portion B1 (namely the barrier portion B1 on the outermost side) most distal from the encapsulation region A1 on the buffer layer 022 overlaps a border line of the first buffer pattern 0221 and the second buffer pattern 0222.

The base substrate 01 needs to be cut in the edge region A2 of the base substrate 01 after each functional film layer is formed on the base substrate 01, such that the display substrate is obtained. Therefore, the probability of edge breakage of the display substrate caused by cutting can be effectively reduced by forming the second buffer pattern 0222 with small thickness on a side, distal from the encapsulation region A1, of the edge region A2, and the problem of encapsulation failure caused by that breakage extending to the encapsulation region may be addressed. Accordingly, the problem that black spots are caused on the display substrate caused by that moisture or oxygen enters the display region can be addressed, and the yield of the display substrate is further increased.

Furthermore, a side, proximal to the encapsulation region A1, of the first groove C, (namely the first groove C1 on the outermost side), most distal from the encapsulation region A1, of the plurality of first grooves C1 overlaps the border line of the first buffer pattern 0221 and the second buffer pattern 0222, that is, the orthographic projections of the plurality of first grooves C1 on the buffer layer 022 only overlap the first buffer pattern 0221. Therefore, by making the orthographic projection of the organic layer 03 on the buffer layer 022 overlap the second buffer pattern 0222, it may be ensured that the organic layer 03 completely covers the barrier portions formed among the plurality of first grooves C1 and further ensure the impact resistance of the display substrate.

In the embodiment of the present disclosure, under the effect of manufacture process and cutting process, the thickness d2 of the second buffer pattern 0222 may be 20% of the thickness d1 of the first buffer pattern 0221. Generally, the base substrate 01 is cut at a position where the second buffer pattern 0222 is located, under the premise that the probability that breakage of edges of the display substrate caused by cutting is effectively decreased, by setting the thickness d2 of the second buffer pattern 0222 to be 20% of the thickness d1 of the first buffer pattern 0221, other problems (such as portions that are unnecessary to be cut may be cut), which are caused by setting a thick second buffer pattern, may be avoided and thus the product quality of the display substrate is further ensured.

The first buffer pattern 0221 and the second buffer pattern 0222 according to the embodiments of the present disclosure may be an integral structure. That is, the first buffer pattern 0221 and the second buffer pattern 0222 may be integrally formed. Alternatively, the first buffer pattern 0221 and the second buffer pattern 0222 may be two separate patterns, that is, the first buffer pattern 0221 and the second buffer pattern 0222 are not integrally formed but are formed by two patterning processes, or by one patterning process using different mask plates. In a case that the first buffer pattern 0221 and the second buffer pattern 0222 are not integrally formed, the first buffer pattern 0221 and the second buffer pattern 0222 may be continuously arranged on the base substrate 01, that is, the first buffer pattern 0221 and the second buffer pattern 0222 are adjacent and are in a direct contact.

Exemplarily, in a case that the first buffer pattern 0221 and the second buffer pattern 0222 are integral structure, they may be formed by the following method: one buffer layer may be formed on the base substrate 01 firstly, and then a part, distal from the encapsulation region A1, of the buffer layer is etched. Or, a part, distal from the encapsulation region A1, of the buffer layer may be etched after a plurality of stacked inorganic film layers are formed on the base substrate 01, and the buffer layer and the plurality of first grooves C1 can be etched synchronously. The etching thickness of the buffer layer 022 may be 80% of the thickness of the buffer layer, such that the first buffer pattern 0221 and the second buffer pattern 0222 which are integrally formed may be obtained.

Figure 6:
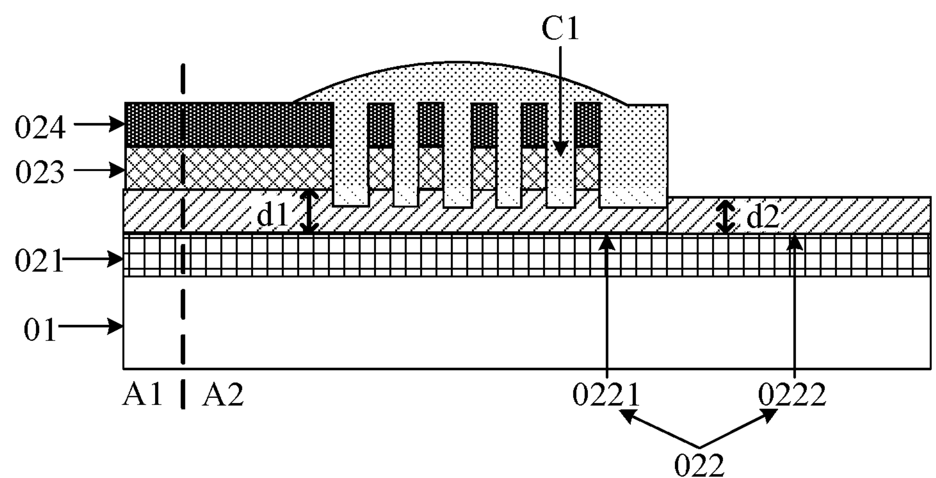
FIG. 6 is a sectional view of another display substrate according to an embodiment of the present disclosure.

As another optional implementation, FIG. 6 is a sectional view of another display substrate according to an embodiment of the present disclosure. As shown in FIG. 6, in the plurality of inorganic film layers, at least one inorganic film layer which each first groove C1 runs through may include: an interlevel dielectric layer 024, a gate insulator layer 023, and a part of a buffer layer 022. That is, each first groove C1 may penetrate through the interlevel dielectric layer 024 and the gate insulator layer 023, and may only pass through a part of the buffer layer 022.

Accordingly, referring to FIG. 6, a barrier portion formed between the two adjacent first grooves C1 may be formed by a buffer layer pattern, a gate insulator layer pattern, and an interlevel dielectric layer pattern which are sequentially stacked. The buffer layer pattern may be disposed in the buffer layer 022, the gate insulator layer pattern may be disposed in the gate insulator layer 023 and the interlevel dielectric layer pattern may be disposed in the interlevel dielectric layer 024.

Figure 7:
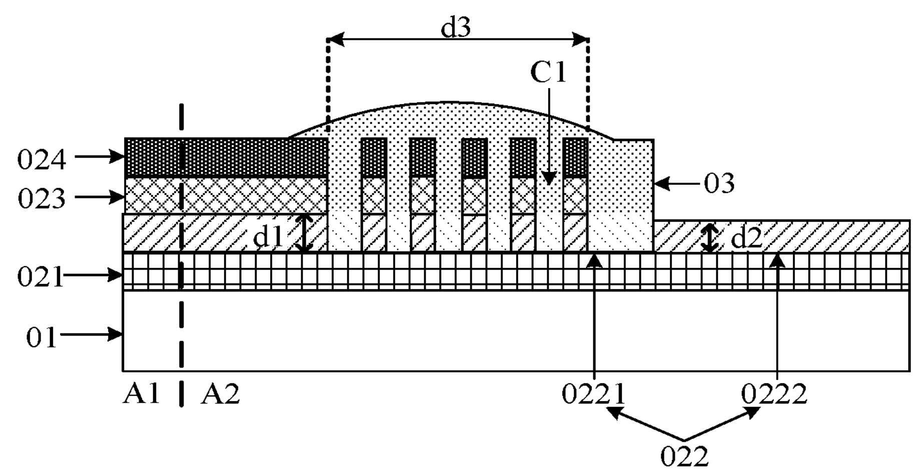
FIG. 7 is a sectional view of another display substrate according to an embodiment of the present disclosure.

As another optional implementation, FIG. 7 is a sectional view of another display substrate according to an embodiment of the present disclosure. As shown in FIG. 7, in the plurality of inorganic film layers, at least one inorganic film layer which each first groove C1 runs through may include: an interlevel dielectric layer 024, a gate insulator layer 023, a buffer layer 022, and a part of a barrier layer 021. That is, each first groove C1 may penetrate through the interlevel dielectric layer 024, the gate insulator layer 023, and the buffer layer 022, and may only pass through a part of the barrier layer 021.

Accordingly, referring to FIG. 7, a barrier portion formed between the two adjacent first grooves may be formed by a barrier layer pattern, a buffer layer pattern, a gate insulator layer pattern, and an interlevel dielectric layer pattern which are sequentially stacked. The barrier layer pattern may be disposed in the barrier layer 021, the gate insulator layer pattern may be disposed in the gate insulator layer 023, and the interlevel dielectric layer pattern may be disposed in the interlevel dielectric layer 024.

As another optional implementation, in the plurality of inorganic film layers in the encapsulation region A1, at least one inorganic film layer which the first groove C1 runs through may only include: an interlevel dielectric layer 024. That is, each first groove C1 may only penetrate through the interlevel dielectric layer 024. Accordingly, a barrier portion formed between the two adjacent first grooves C1 may only be formed by an interlevel dielectric layer pattern.

Referring to FIG. 7, a distance d3 between a side, proximal to the encapsulation region A1, of the first groove C1 (the first groove on the innermost side), proximal to the encapsulation region A1, of the plurality of first grooves C1 and a side, proximal to the encapsulation region A1, of the first groove C1 (namely the first groove on the outermost side), distal from the encapsulation region A1, of the plurality of first grooves C1 may be approximately 60 microns. That is, when a part, disposed in the edge region A2, of the at least one inorganic film layer is to be etched, etching may be started at a position of 60 microns distal from the edge of the at least one inorganic film.

The distance d3 being approximately 60 microns refers to that a difference between a distance and 60 microns is in an allowable error range of technological parameter. For example, if the allowable error range of technological parameter is 0.01 micron, the distance d3 being approximately 60 microns may refer to that the distance d3 is larger than or equal to 59.99 microns (60 microns minus 0.01 micron), and is smaller than or equal to 60.01 microns (60 microns plus 0.01 micron). The allowable error range of technological parameter is not limited in the embodiments of the present application.

FIG. 8 to FIG. 11 are top views of a plurality of display substrates according to embodiments of the present disclosure. As shown in FIG. 7 to FIG. 11, an orthographic projection of each first groove C1 on the base substrate 01 may be an annular shape with an opening. For example, referring to FIG. 8, which shows a first groove C1, including two annular shapes with openings. For another example, reference is made to FIGS. 9 to 11, all of which are illustrated with one first groove C1 closest to the encapsulation region A1. In the embodiment of the present disclosure, the inorganic film layer may include a plurality of first grooves C1.

Referring to FIG. 8 to FIG. 11, it can be seen that each annular shape (namely each first groove C1) may surround the encapsulation region A1, an orthographic projection of each opening K2 on the base substrate 01 may overlap the bonding region A21, that is, a width of each opening K2 may be greater than a width of the bonding region A21. The first groove C1 of an annular shape surrounds the encapsulation region A1, such that the periphery of the encapsulation region A1 may be effectively protected and the quality of the display substrate is further ensured.

Referring to FIG. 1 and FIG. 8 to FIG. 11, the base substrate 01 further includes a display region A11. A shape of a side, distal from the bonding region A21, of the annular shape matches a shape of a side, distal from the bonding region A21, of the display region A11. For example, referring to FIG. 11, a side, distal from the bonding region A21, of the display region A11 includes a notch, that is, a middle part of a side, distal from the bonding region A21, of the display region A11 is sunken towards a side proximal to the bonding region A21. Accordingly, a side, distal from the bonding region A21, of the annular shape is provided with a notch, that is, referring to FIG. 11, a middle part of a side, distal from the bonding region A21, of the annular shape, namely the first groove C1 is sunken towards a side proximal to the bonding region A21. Moreover, the notch of a side, distal from the bonding region A21, of the first groove C1 and the notch of a side, distal from the bonding region A21, of the display region A11 have the same position, shape and size.

Figure 9:
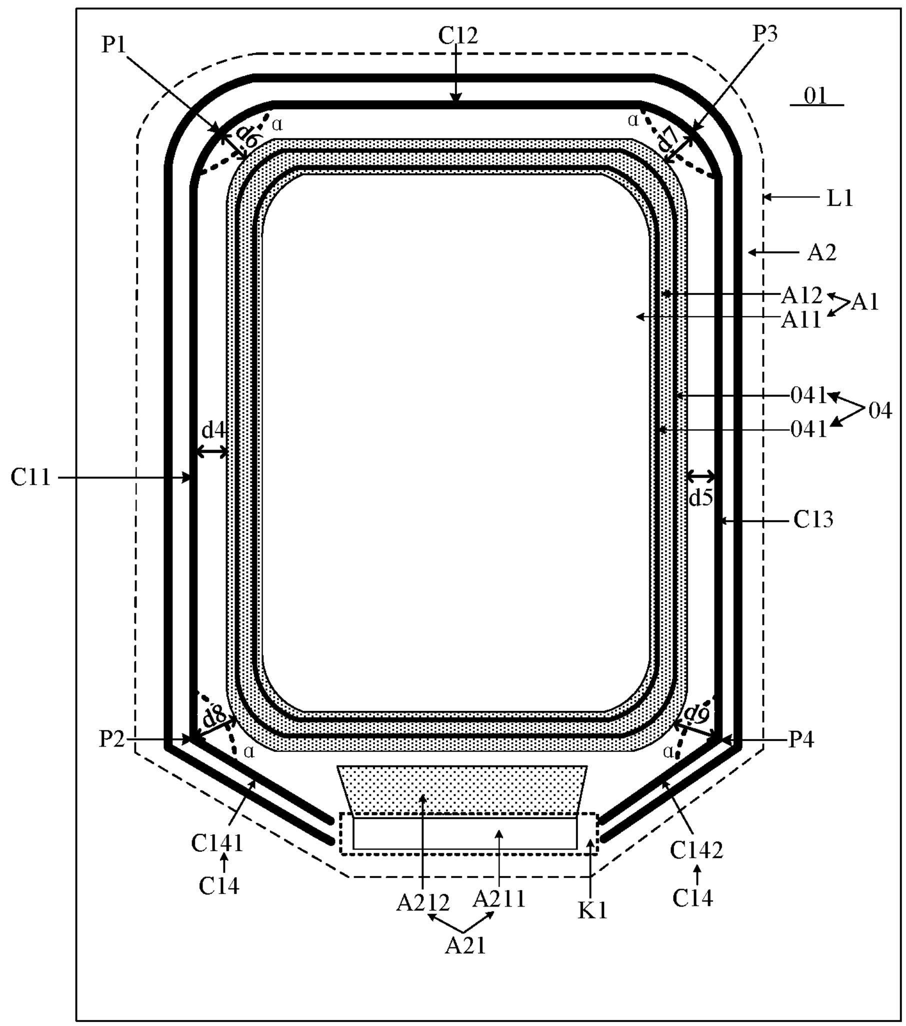
FIG. 9 is a top view of another display substrate according to an embodiment of the present disclosure.

In the embodiment of the present disclosure, referring to FIG. 9, the encapsulation region A1 may include a display region A11 and a peripheral region A12 surrounding the display region A11. The annular shape formed by the orthographic projection of the first groove C1 on the base substrate 01 may include: a first side edge C11, a second side edge C12, a third side edge C13, and a fourth side edge C14 which are sequentially connected to each other;

wherein the first side edge C11 and the third side edge C13 may be oppositely arranged, the second side edge C12 and the fourth side edge C14 may be oppositely arranged, the fourth side edge C14 may be disposed on a side where the bonding region A21 is, and the fourth side edge C14 may be provided with the opening, that is, referring to FIG. 9, the fourth side edge C14 is divided into two sections by the opening. The first side edge C11 and the third side edge C13 may further be arranged in parallel, and the second side edge C12 and the fourth side edge C14 may further be arranged in parallel.

As shown in FIG. 9, a distance d4 between the first side edge C11 and a side, distal from the display region A11, of the peripheral region A12 is equal to a distance d5 between the third side edge C13 and a side, distal from the display region A11, of the peripheral region A12.

A distance d6 between an intersection P1 of the first side edge C11 and the second side edge C12 and a side, distal from the display region A11, of the peripheral region A12 is equal to a distance d8 between an intersection P2 of the first side edge C11 and the fourth side edge C14 and a side, distal from the display region A11, of the peripheral region A12. A distance d7 between an intersection P3 of the third side edge C13 and the second side edge C12 and a side, distal from the display region A11, of the peripheral region A12 is equal to a distance d9 between an intersection P4 of the third side edge C13 and the fourth side edge C14 and a side, distal from the display region A11, of the peripheral region A12.

Furthermore, the distance d6 between the intersection P1 of the first side edge C11 and the second side edge C12 and a side, distal from the display region A11, of the peripheral region A12 may be equal to the distance d7 between the intersection P3 of the third side edge C13 and the second side edge C12 and a side, distal from the display region A11, of the peripheral region A12; and the distance d8 between the intersection P2 of the first side edge C11 and the fourth side edge C14 and a side, distal from the display region A11, of the peripheral region A12 may be equal to the distance d9 between the intersection of the third side edge C13 and the fourth side edge C14 and a side, distal from the display region A11, of the peripheral region A12. The distance d4 between the first side edge C11 and a side, distal from the display region A11, of the peripheral region A12, and the distance d5 between the third side edge C13 and a side, distal from the display region A11, of the peripheral region A12 may be less than the distance d6 between the intersection P1 of the first side edge C11 and the second side edge C12 and a side, distal from the display region A11, of the peripheral region A12, and less than the distance d7 between the intersection P3 of the third side edge C13 and the second side edge C12 and a side, distal from the display region A11, of the peripheral region A12.

That is, the distances (d4, d5) between the left side and the right of the annular shape and a side, distal from the display region A11, of the peripheral region A12 may be equal. The distances (d6, d7) between two angles of a side, distal from the bonding region A21, of the annular shape and a side, distal from the display region A11, of the peripheral region A12 may be equal. The distances (d8, d9) between two angles of a side, proximal to the bonding region A21, of the annular shape and a side, distal from the display region A11, of the peripheral region A12 may be equal. The distances (d6, d7) between the two angles of a side, distal from the bonding region A21, of the annular shape and a side, distal from the display region A11, of the peripheral region A12 are less than the distances (d8, d9) between the two angles of a side, proximal to the bonding region A21, of the annular shape and a side, distal from the display region A11, of the peripheral region A12. The distances (d4, d5) between the left side and the right of the annular shape and a side, distal from the display region A11, of the peripheral region A12 is less than the distances (d6, d7) between the two angles of a side, distal from the bonding region A21, of the annular shape and a side, distal from the display region A11, of the peripheral region A12.

In the embodiment of the present disclosure, for each side edge of the annular shape, a distance between each side edge and a side, distal from the display region A11, of the peripheral region A12 may refer to the shortest distance between the side edge and a side, distal from the display region A11, of the peripheral region A12.

A distance of each position of the annular groove (namely the first groove C1) and the edge of the base substrate 01 may be equal. The distance may refer to the shortest distance between any one position of the first groove C1 and the edge of the base substrate 01.

Referring to FIG. 9, the fourth side edge C14 may include a first portion C141 and a second portion C142 which are divided by the opening K1. In angles formed by each two of adjacent side edges of the side edges of the annular shape, at least one angle may be a fillet, wherein in two side edges forming the fillet, one section, proximal to the other side edge, of each side edge may be arc-shaped.

Figure 8:
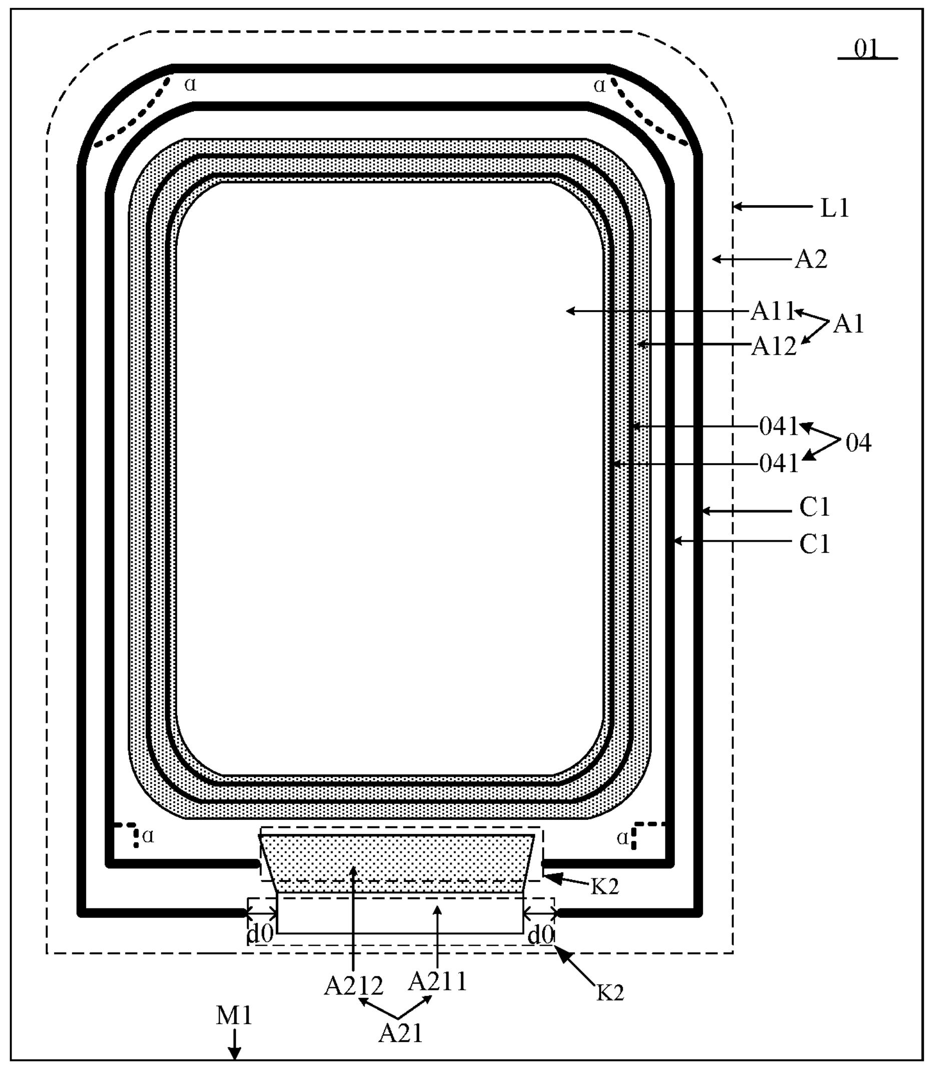
FIG. 8 is a top view of another display substrate according to an embodiment of the present disclosure.

For example, referring to FIG. 8 and FIG. 9, an angle α formed by the first side edge C11 and the second side edge C12, and an angle α formed by the third side edge C13 and the second side edge C12 may be fillets. An angle α formed by the first side edge C11 and the first portion C141 of the fourth side edge C14, and an angle α formed by the third side edge C13 and the second portion C142 of the fourth side edge C14 may be square corners. That is, one section, proximal to the other side edge, of each side edge of the first side edge C11 and the first portion C141 of the fourth side edge C14 may be linear. One section, proximal to the other side edge, of each side edge of the third side edge C13 and the second portion C142 of the fourth side edge C14 may be linear.

Figure 10:
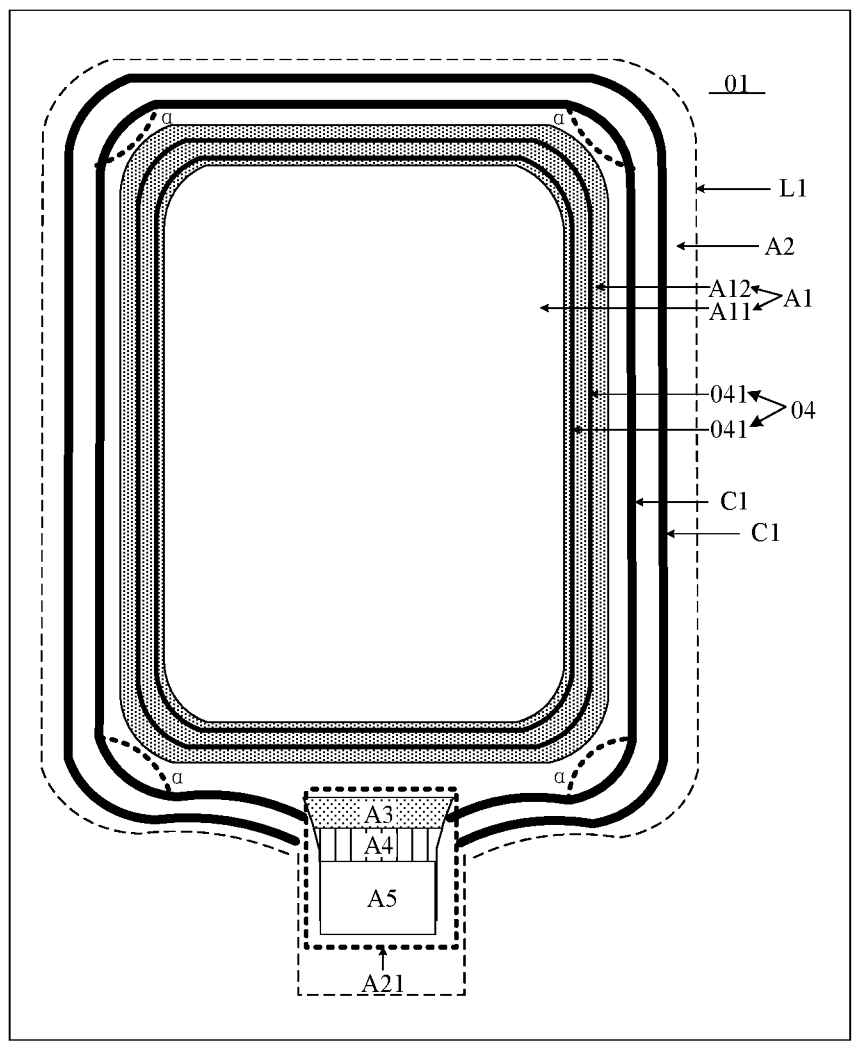
FIG. 10 is a top view of another display substrate according to an embodiment of the present disclosure.
Figure 11:
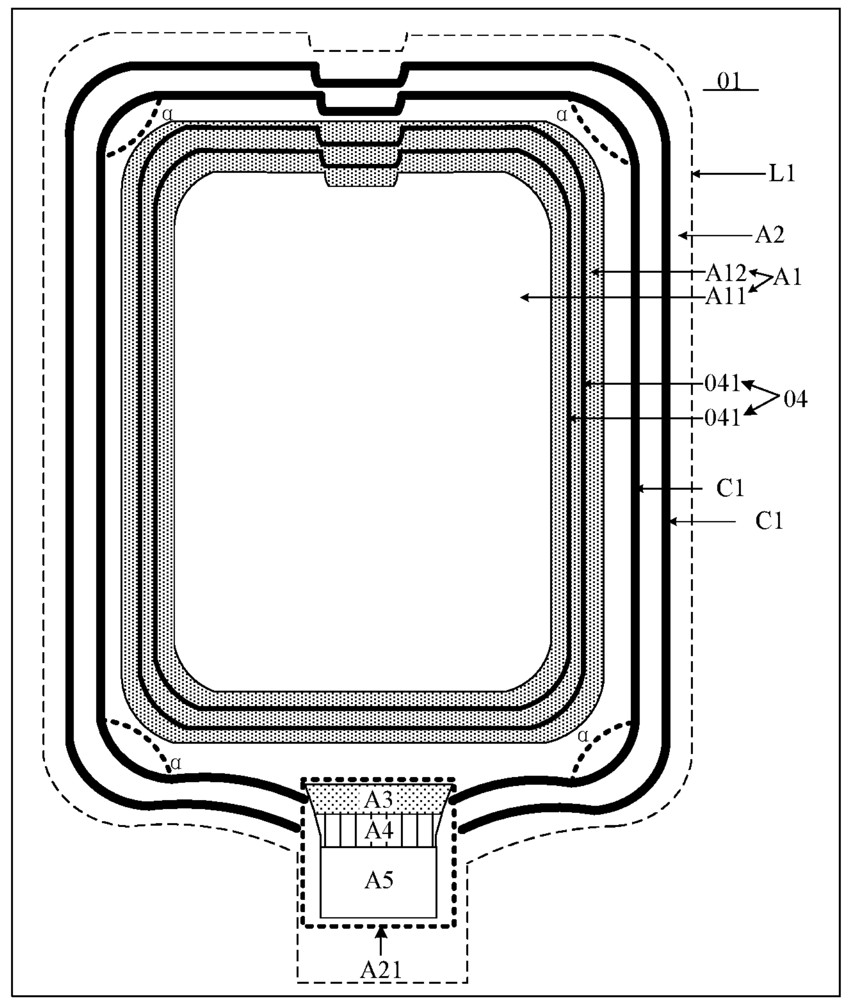
FIG. 11 is a top view of another display substrate according to an embodiment of the present disclosure.
Figure 11:
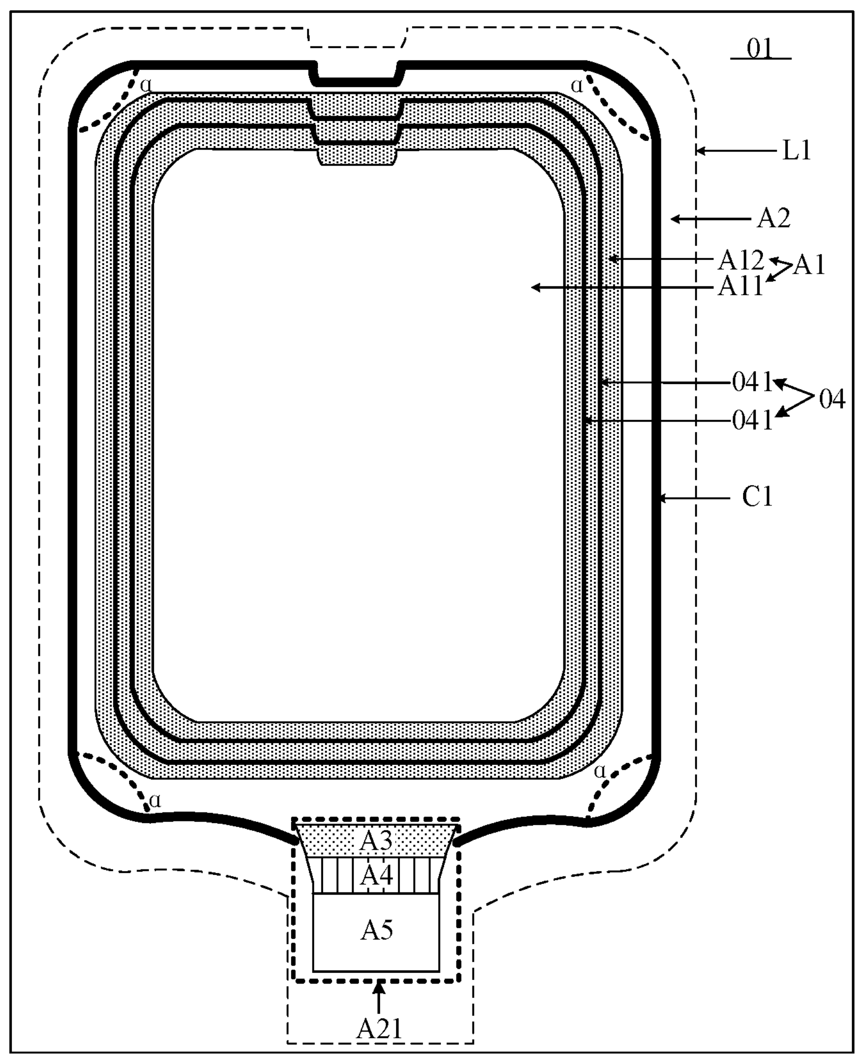

For another example, referring to FIG. 10 and FIG. 11, the annular shape may be a rectangular shape of which a side is open, and an angle α formed by each two of adjacent side edges may be a fillet.

In the embodiment of the present disclosure, an angle formed by the first side edge C11 and the first portion C141, and an angle formed by the third side edge C13 and the second portion C142 may be greater than or approximately equal to 90 degrees but is smaller than 180 degrees. The formed angle being approximately 90 degrees may refer to that a difference between the formed angle and 90 degrees is in an allowable error range of technical parameter. For example, if the allowable error range of technical parameter is 0.1 degree, the formed angle being approximately 90 degrees may refer to that the formed angle is larger than or equal to 89.9 degrees (90 degrees minus 0.1 degree), and is smaller than or equal to 90.1 degrees (90 degrees plus 0.1 degree).

For example, referring to FIG. 8, an angle α formed by the first side edge C11 and the first portion C141, and an angle α formed by the third side edge C13 and the second portion C142 may be equal to 90 degrees, namely right angles. For another example, referring to FIG. 9 to FIG. 11, an angle α formed by the first side edge C11 and the first portion C141, and an angle α formed by the third side edge C13 and the second portion C142 may be greater than 90 degrees and is smaller than 180 degrees, namely obtuse angles that is smaller than 180 degrees.

In the embodiment of the present disclosure, referring to FIG. 8 and FIG. 9, the bonding region A21 may include a bonding pad A211 and a wiring fanout region A212. The bonding pad A211 overlaps an orthographic projection of an opening K1 on the bonding region A21. For example, referring to FIG. 9, two ends of the first groove C1 are disposed on two sides of the bonding pad A211.

Furthermore, the two ends of the first groove C1 are disposed on the edge of the side of a side, proximal to the bonding region A21, of the base substrate 01, that is, referring to FIG. 8, the two ends of the first groove C1 are disposed on a lower edge M1 of the base substrate 01. Moreover, a distance d0 between each of the two ends of the first groove C1 and the bonding pad A211 is approximately 5 to 10 microns. The distance d0 being approximately 5 microns refers to that a difference between a distance d0 and 5 microns is in an allowable error range of technological parameter. For example, if the allowable error range of technological parameter is 0.02 micron, the distance d0 being approximately 5 microns may refer to that the distance d0 is larger than or equal to 4.98 microns (5 microns minus 0.02 micron), and is smaller than or equal to 5.02 microns (5 microns plus 0.02 micron). The distance d0 being approximately 10 microns refers to that a difference between the distance d0 and 10 microns is in an allowable error range of technological parameter. For example, if the allowable error range of technological parameter is 0.02 micron, the distance d0 being approximately 10 microns may refer to that the distance d0 is larger than or equal to 9.98 microns (10 microns minus 0.02 micron), and is smaller than or equal to 10.02 microns (10 microns plus 0.02 micron). It is the same for the value between 5 microns and 10 microns.

In the embodiment of the present disclosure, the base substrate 01 may be a flexible substrate. That is, the base substrate 01 may be made of a flexible material. Accordingly, referring to FIG. 10 and FIG. 11, the bonding region A21 may include: a first sub-region A3, a bending region A4, and a second sub-region A5, and a part, disposed in the bending region A4, of the base substrate 01 may be bending-shaped. The first sub-region A3 is disposed on a front surface of the display substrate, that is, the first sub-region A3 and the display region A11 are disposed on the same surface; and the second sub-region A5 is bended in a region on a back surface of the display substrate, that is, the second sub-region A5 and the display region A11 are disposed on different surfaces. The bonding pad A211 in the bonding region A21 may be disposed in the second sub-region A5, and the wiring fanout region A212 in the bonding region A21 may be disposed in the first sub-region A3 and the bending region A4.

Furthermore, referring to FIG. 10 and FIG. 11, orthographic projections of the two ends of the first groove C1 on the base substrate 01 do not overlap the bending region A4, and are disposed on a side, proximal to the bending area A4, of the first sub-region A3.

An inorganic material has low hardness, and the bending region A4 is implemented by bending the base substrate by a special process after the plurality of first grooves C1 are formed. Therefore, enabling the orthographic projections of the plurality of first grooves C1 on the base substrate 01 to be disposed on a side, proximal to the bending region A4, of the first sub-region A3 may prevent the barrier portion formed between the two adjacent first grooves from being broken when the bending region A4 is formed, and the quality of the display substrate is further ensured.

The plurality of inorganic film layers which the display substrate include may further include a second groove, wherein an orthographic projection of the second groove on the base substrate may cover the bending region A4, and the second groove may run through the interlevel dielectric layer 024, the gate insulator layer 023, the buffer layer 022, and a part of the barrier layer 021. That is, the second groove may penetrate through the interlevel dielectric layer 024, the gate insulator layer 023, and the buffer layer 022, and may only pass through a part of the buffer layer 021.

For example, parts, disposed in the bending region A4, of the interlevel dielectric layers 024, the gate insulator layers 023, the buffer layers 022, and a part of the barrier layers 021 in the plurality of inorganic film layers may be etched to obtain the second groove. A bending process on the base substrate 01 is performed after the plurality of inorganic film layers are formed. Therefore, the bending process may be facilitated by forming the second groove in the bending region A4 firstly, namely, etching the inorganic film layer in the bending region A4 firstly to enable the film layer on the base substrate 01 in the bending region A4 to be thinner.

The inorganic film layer in the second sub-region A5 may include an interlevel dielectric layer 024 and a gate insulator layer 023. That is, the inorganic film layer disposed in the second sub-region A5 may not be etched, and the inorganic film layer disposed in the first sub-region A3 may not be etched. Furthermore, a pin position in the bonding pad A211 may further include a source metal layer and a drain metal layer which are disposed on a side, distal from the base substrate 01, of the plurality of inorganic film layers 02, wherein the source metal layer and a source metal layer in the display region A11 may be formed by a patterning process, and the drain metal layer and a drain metal layer in the display region A11 may also be formed by a patterning process.

It should be noted that, referring to FIG. 8 to FIG. 11, the edge region A2 of the base substrate 01 may be further provided with a cutting line L1 surrounding the first groove C1. After the inorganic film layer with a plurality of first grooves C1 is formed on a side of the base substrate 01, cutting may be performed along the cutting line L1 to obtain the display substrate. Accordingly, the annular shape matches a shape of the cutting line L1. That is, the annular first groove C1 may be designed along the shape of the cutting line L1.

During cutting operation, the edge of the display substrate is easily subject to cracks. Therefore, the first groove designed along the shape of the cutting line L1 may effectively block the crack generated by the cutting operation and may effectively prevent extension of the crack which is caused during the cutting.

In the embodiment of the present disclosure, as shown in FIG. 3 to FIG. 8, the plurality of first grooves C1 included in the display substrate may be arranged equidistantly, that is, a distance between each two of adjacent first grooves C1 may be a fixed value. By the plurality of first grooves C1 spaced apart from each other, extension of the crack may be further prevented effectively and the quality of the display substrate may be ensured.

For example, referring to FIG. 3 to FIG. 7, a first groove C1, including five annular shapes with openings, is shown. For another example, referring to FIG. 8, a first groove including two annular shapes with openings is shown.

In the embodiment of the present disclosure, the annular shape may be surrounded by at least one of a strip shape and an arc shape. For example, referring to FIG. 8 to FIG. 11, the annular shape is surrounded by a plurality of strip-shaped structures and a plurality of arc-shaped structures.

Figure 12:
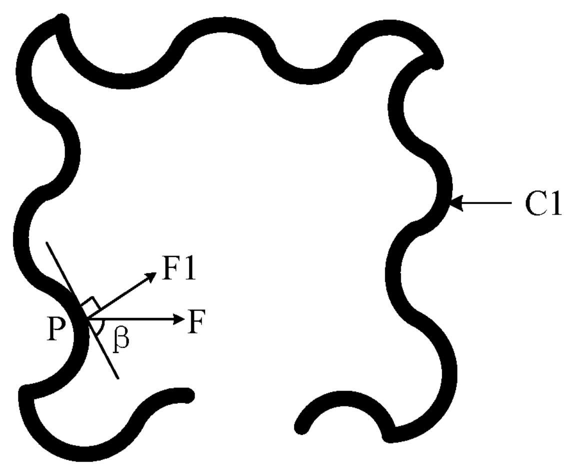
FIG. 12 is a top view of a first annular structure according to an embodiment of the present disclosure.

FIG. 12 is a top view of a first groove C1, in an annular shape with an opening, according to an embodiment of the present disclosure. As shown in FIG. 12, the annular shape may be surrounded by a plurality of arc-shaped structures. For example, an orthographic projection of each side of the annular shape on the base substrate 01 may be in a waves shape.

Referring to FIG. 12, assuming that an external force acts on the annular first groove C1, an impact force in a first direction generated at a point P on the first groove C1 is F, then the impact force F may be resolved into an impact force in a second direction by the arc-shaped first groove C1, and the impact force F1 in the second direction meets: $F1=F*\sin(\beta)$, the second direction is vertical to a tangential direction of the point P, and $\beta$ is an included angle between the tangential direction and the first direction.

According to the above analysis, the $\sin(\beta)$ is less than or equal to 1, and thus for the annular shape surrounded by the arc shape, the impact force F1 in the second direction may be less than or equal to F. Relative to the strip shape, the annular shape surrounded by the arc shape is subjected to a lower impact force. Accordingly, the ability of blocking extension of the crack by the first groove C1 may be further improved and the risk of crack extension may be effectively reduced.

Referring to FIG. 8 to FIG. 11, the encapsulation region A1 includes a display region A11 and a peripheral region A12 surrounding the display region A11, and the display substrate may further include: a barrier dam 04 disposed in the peripheral region A12. The barrier dam 04 may further be made of an organic material. An orthographic projection of the organic layer 03 on the base substrate 01 may not overlap an orthographic projection of the barrier dam 04 on the base substrate 01.

The barrier damp 04 is disposed in the peripheral region A12 and a gap may exist between the barrier dam 04 and the display region A11. Therefore, the organic material may be effectively prevented from flowing out of the encapsulation region A1 when an organic encapsulation film layer in an encapsulation film is formed by the organic material, the problem that the quality of the display region is affected by that moisture in the air enters the display region due to the hydrophilic characteristic of the organic material may be effectively avoided, and the quality of the display substrate may be further enhanced.

Referring to FIG. 8 to FIG. 11, the barrier dam may include at least one closed annular structure 041, wherein each annular structure may surround the display region A11 of the base substrate 01. The annular structure 041 surrounds the display region A11, such that the periphery of the display region A11 may be effectively protected.

The barrier dam 04 may include a plurality of annular structures 041 which are spaced apart from each other. For example, FIG. 8 to FIG. 11 show the barrier dam 04, including two annular structures 041. Furthermore, the plurality of annular structures 041 may be spaced apart from each other, that is, a distance between each two of adjacent annular structures 041 may be a fixed value. The plurality of annular structures 041 are spaced apart from each other, such that effective protection on the display region A11 may be further improved. Exemplarily, the barrier dam 04 may be formed by a deposition mode.

It should be noted that, in the embodiment of the present disclosure, the base substrate 01 may be made of a flexible material. The flexible material may be a polyimide (PI) material and has good high-temperature resistance, low-temperature resistance, oxidation resistance and the like.

In conclusion, the embodiment of the present disclosure provides a display substrate. An edge region of a base substrate not only includes a plurality of first grooves running through at least one inorganic film layer, but also includes an organic layer covering the plurality of first grooves, wherein a hardness of an organic material for forming the organic layer is greater than to a hardness of an inorganic material for forming the inorganic film layer. Therefore, the impact resistance of the display substrate is effectively improved by soft and hard matching, an external force on the display substrate is buffered, the problem of encapsulation failure caused by extension of the crack to the encapsulation region may be effectively addressed, and the quality of the display substrate may be enhanced. Furthermore, by making the orthographic projections of the plurality of first grooves on the base substrate not overlap the bonding region, a metal wire disposed in the bonding region may be prevented from being exposed and corroded when the first grooves are formed by an etching process, thereby ensuring the yield of the display substrate.

Figure 13:
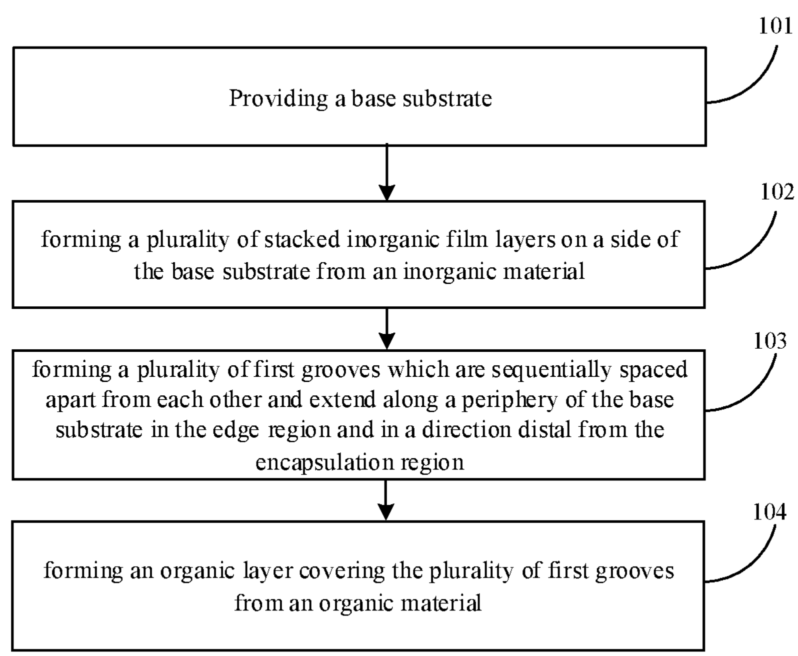
FIG. 13 is a flow chart of a manufacturing method for a display substrate according to an embodiment of the present disclosure.

FIG. 13 is a flow chart of a manufacturing method for a display substrate according to an embodiment of the present disclosure. The method may be used for manufacturing the display substrate as shown in any one of FIG. 1 to FIG. 11. As shown in FIG. 13, the method may include the following steps:

In step 101, a base substrate is provided.

The base substrate may be a glass substrate. Referring to FIG. 1, the base substrate 01 may include an encapsulation region A1 and an edge region A2 disposed on a periphery of the encapsulation region A1, wherein the edge region A2 may include a bonding region disposed on a side where at least one side of the base substrate 01 is disposed.

The base substrate 01 may include two flexible material layers and a barrier layer disposed between the two flexible material layers, wherein a flexible material forming the flexible material layer may be a PI material.

In step 102, a plurality of stacked inorganic film layers are formed on a side of the base substrate from an inorganic material.

In the embodiment of the present disclosure, the plurality of inorganic film layers may be formed on a side of the base substrate by a patterning process and by the inorganic material, wherein the patterning process may include: gluing, exposing, developing, and etching, and the inorganic material may include at least one of silicon oxide, silicon nitride and silicon oxynitride.

The plurality of inorganic film layers may include: a barrier layer, a buffer layer, a gate insulator layer, and an interlevel dielectric layer which are sequentially stacked, wherein the barrier layer may effectively prevent moisture or oxygen from entering the base substrate, such that moisture blocking, oxygen blocking and scraping resistance of the base substrate are improved. The inorganic material may include at least one of silicon oxide, silicon nitride and silicon oxynitride. Furthermore, the inorganic materials forming different inorganic film layers may be the same or different.

In step 103, a plurality of first grooves, which are sequentially spaced apart from each other and extend along a periphery of the base substrate, are formed in the edge region and in a direction distal from the encapsulation region.

In the embodiment of the present disclosure, a part, disposed in the edge region A2, of at least one inorganic film layer of the plurality of inorganic film layers may be etched to obtain the plurality of first grooves.

Each first groove may run through at least one inorganic film layer of the plurality of inorganic film layers, and orthographic projections of the plurality of first grooves on the base substrate do not overlap the bonding region, and a distance between each first groove and the display region is larger than a distance between each first groove and the edge of the base substrate. The first groove disposed in the edge region is formed, such that a crack in the edge region can be blocked.

In step 104, an organic layer covering the plurality of first grooves is formed from organic material.

In the embodiment of the present disclosure, the organic layer covering the first groove is formed on a side, distal from the base substrate, of the plurality of first grooves. The organic layer covering the first groove is formed, such that buffer action is achieved when a collision occurs in a direction vertical to the base substrate. The hardness of the organic material is greater than the hardness of the inorganic material, and thus the impact resistance of the display substrate may be further improved by soft and hard matching, and extension of the crack is further prevented effectively.

In conclusion, the embodiment of the present disclosure provides a method for manufacturing the display substrate. The plurality of first grooves running through the at least one inorganic film layer is formed in the edge region by the inorganic material, and the organic layer covering the plurality of first grooves is formed by the organic material with the hardness greater than that of the inorganic material, such that the impact resistance of the display substrate may be effectively improved by soft and hard matching, an external force on the display substrate is buffered, and the problem of encapsulation failure caused by extension of the crack to the encapsulation region may be effectively addressed. Thus, the problem that black spots are caused on the display substrate caused by that moisture or oxygen enters the display region through the crack when the crack extends to the display region may be effectively prevented, and the quality of the display substrate may be enhanced. Furthermore, by making the orthographic projections of the plurality of first grooves on the base substrate not overlap the bonding region, a metal wire disposed in the bonding region may be prevented from being exposed and corroded when the first grooves are formed by an etching process, thereby ensuring the yield of the display substrate.

Forming the plurality of first grooves (namely the step 103) may include: etching a part, disposed in the edge region, of at least one inorganic film layer of the plurality of inorganic film layers to obtain the plurality of first grooves.

Before the at least one inorganic film layer is etched, the at least one to-be-etched inorganic film layer may be processed by gluing, exposing, and developing.

As an optional implementation, as shown in FIG. 3 and FIG. 4, in the plurality of inorganic film layers, at least one inorganic film layer which the first groove C1 runs through may include: a gate insulator layer 023 and an interlevel dielectric layer 024 which are sequentially stacked along a direction distal from the base substrate. Accordingly, the step 103 may be: etching parts, disposed in the edge region, of the gate insulator layers and the interlevel dielectric layers of the plurality of inorganic film layers.

Before the step 103, the method for manufacturing the display substrate may further include: forming a buffer layer on a side of the base substrate.

In the embodiment of the present disclosure, the buffer layer may be formed from an inorganic material. Referring to FIG. 4, the buffer layer 022 may include a first buffer pattern 0221 and a second buffer pattern 0222. An orthographic projection of the first buffer pattern 0221 on the base substrate 01 covers the encapsulation region A1 and a part of the edge region A2, and the second buffer pattern 0222 is disposed in the edge region A2. A thickness of the first buffer pattern is greater than a thickness of the second buffer pattern 0222. Furthermore, an orthographic projection of the organic layer 02 on the buffer layer 022 partially overlaps the second buffer pattern 0222, and an orthographic projection of a side, away from the encapsulation region A1, of the first groove C1*a* (namely the first groove C1*a* on the outermost side), most distal from the encapsulation region A1, of the plurality of first grooves C1 on the buffer layer 022 overlaps a border line of the first buffer pattern 0221 and the second buffer pattern 0222.

The base substrate 01 needs to be cut in the edge region A2 of the base substrate 01 after a plurality of functional film layers are formed on the base substrate 01, such that the display substrate is obtained. Therefore, the probability of edge breakage of the display substrate caused by large cutting force may be effectively reduced by forming the second buffer pattern 0222 with small thickness on a side, distal from the encapsulation region A1, of the edge region A2, and the yield of the display substrate is further increased.

Furthermore, an orthographic projection of a side, proximal to the encapsulation region A1, of the first groove C1, most distal from the encapsulation region A1, of the plurality of first grooves C1 on the buffer layer 022 overlaps the border line of the first buffer pattern 0221 and the second buffer pattern 0222, that is, the orthographic projections of the plurality of first grooves C1 on the buffer layer 022 only overlap the first buffer pattern 0221. Therefore, by making the orthographic projection of the organic layer 03 on the buffer layer 022 partially overlap the second buffer pattern 0222, it may be ensured that that the organic layer 03 completely covers the barrier portions formed among the plurality of first grooves C1 and further ensure the impact resistance of the display substrate.

As another optional implementation, as shown in FIG. 6, in the plurality of inorganic film layers, at least one inorganic film layer which each first groove C1 runs through may include: an interlevel dielectric layer 024, a gate insulator layer 023, and a part of a buffer layer 022. Accordingly, the step 103 may be: etching parts, disposed in the edge region, of the interlevel dielectric layers, the gate insulator layers, and a part of the buffer layers of the plurality of inorganic film layers.

As another optional implementation, as shown in FIG. 7, in the plurality of inorganic film layers, at least one inorganic film layer which each first groove C1 runs through may include: an interlevel dielectric layer 024, a gate insulator layer 023, a buffer layer 022, and a part of a barrier layer 021. Accordingly, step 103 may be: etching parts, disposed in the edge region, of the interlevel dielectric layers, the gate insulator layers, and a part of the barrier layers of the plurality of inorganic film layers.

As another optional implementation, in the plurality of inorganic film layers, at least one inorganic film layer which the first groove C1 runs through may only include: an interlevel dielectric layer arranged along a direction distal from the base substrate. Accordingly, step 103 may be: etching parts, disposed in the edge region, of the interlevel dielectric layers of the plurality of inorganic film layers.

Before steps 102 to 104, or after steps 102 to 104, the method may further include: forming a barrier dam in the peripheral region, which the encapsulation region includes, from an organic material.

The barrier dam may be formed on a side, distal from the base substrate, of the plurality of inorganic film layers by the organic material and by a deposition mode, wherein gap exists between the barrier dam and the display region. Furthermore, an orthographic projection of the organic layer on the base substrate does not overlap an orthographic projection of the barrier dam on the base substrate. The barrier damp is disposed in the peripheral region which the encapsulation region includes, and a gap exists between the barrier dam and the display region which the encapsulation region includes. Therefore, the barrier dam may effectively prevent the organic material from flowing out of the encapsulation region A1 when an organic encapsulation film layer in an encapsulation film is formed by the organic material, the problem that the quality of the display region is affected by that moisture in the air enters the display region due to the hydrophilic characteristic of the organic material may be effectively avoided, and the quality of the display substrate may be further enhanced.

In conclusion, the embodiment of the present disclosure provides a method for manufacturing the display substrate. The plurality of first grooves running through the at least one inorganic film layer is formed in the edge region by the inorganic material, and the organic layer covering the plurality of first grooves is formed by the organic material with the hardness greater than that of the inorganic material, such that the impact resistance of the display substrate may be effectively improved by soft and hard matching, an external force on the display substrate is buffered, and the problem of encapsulation failure caused by extension of the crack to the encapsulation region may be effectively addressed. Thus the problem that black spots are caused on the display substrate caused by that moisture or oxygen enters the display region through the crack when the crack extends to the display region may be effectively avoided, and the quality of the display substrate may be enhanced. Furthermore, by making the orthographic projections of the plurality of first grooves on the base substrate not overlap the bonding region, a metal wire disposed in the bonding region may be prevented from being exposed and corroded when the first grooves are formed by an etching process, thereby ensuring the yield of the display substrate.

The embodiment of the present disclosure provides a display device. The display device may include a display substrate as shown in any one of FIG. 1 to FIG. 11. The display may be: any products or parts with a display function, such as a liquid crystal panel, electronic paper, an OLED panel, an AMOLED panel, a mobile phone, a tablet personal computer, a television, a display, a notebook computer, a digital photo frame, a navigator, or the like, wherein the AMOLED panel may be a flexible display panel.

It should be noted that in the accompanying drawings, the size of layers and regions may be exaggerated for clarity of illustration. And it can be understood that when an element or layer is referred to as being "on" another element or layer, it can be directly on the other element, or intervening layers may be present. In addition, it can be understood that when an element or layer is referred to as being "under" another element or layer, it can be directly under the other element, or more than one intervening layer or element may be present. In addition, it can also be understood that when a layer or element is referred to as being "between" two layers or two elements, it can be the only layer between the two layers or two elements, or more than one intervening layer may also be present or components. Similar reference signs indicate similar elements throughout.

The terms "first" and "second" are for descriptive purposes only, and cannot be understood as indicating or implying relative importance. The term "plurality" refers to two or more, unless expressly defined otherwise. The term "approximately" is only used to indicate the approximate value range or the size of the value, and does not limit the value.

Described above are merely optional embodiments of the present disclosure, but are not intended to limit the present disclosure. Within the spirit and principles of the disclosure, any modifications, equivalent substitutions, improvements, or the like are within the protection scope of the present disclosure.

What is claimed is:

1. A display substrate, comprising:

a base substrate with an encapsulation region and an edge region on a periphery of the encapsulation region, wherein the encapsulation region comprises a display region and a peripheral region surrounding the display region, and the edge region comprises a bonding region on at least one side of the base substrate;

a plurality of stacked inorganic film layers on a side of the base substrate;

a plurality of first grooves, at the edge region, spaced apart from each other in a direction distal from the encapsulation region, and extending along a periphery of the base substrate, wherein the plurality of first grooves run through at least one inorganic film layer of the plurality of stacked inorganic film layers, and orthographic projections of the plurality of first grooves on the base substrate have a non-overlapping region with the bonding region, and distances between the plurality of first grooves and the display region are larger than distances between the plurality of first grooves and an edge of the base substrate; and an organic layer, covering the plurality of first grooves;

wherein the plurality of stacked inorganic film layers further comprise a buffer layer comprising a first buffer pattern and a second buffer pattern; wherein an orthographic projection of the first buffer pattern on the base substrate covers the encapsulation region and a part of the edge region, the second buffer pattern is in the edge region, a thickness of the first buffer pattern is greater than a thickness of the second buffer pattern, and a direction of the thickness of the first buffer pattern and a direction of the thickness of the second buffer pattern are both vertical to a bearing surface of the base substrate; and an orthographic projection of the organic layer on the buffer layer partially overlaps the second buffer pattern, and an orthographic projection of a side, away from the encapsulation region, of one first groove, most distal from the encapsulation region, of the plurality of first grooves on the buffer layer overlaps a border line of the first buffer pattern and the second buffer pattern.

2. The display substrate according to claim 1, wherein the thickness of the second buffer pattern is 20% of the thickness of the first buffer pattern.

3. The display substrate according to claim 1, wherein the plurality of stacked inorganic film layers comprise: a barrier layer, the buffer layer, a gate insulator layer, and an interlevel dielectric layer stacked along a direction distal from the base substrate;

wherein the at least one inorganic film layer comprises: the interlevel dielectric layer and the gate insulator layer.

4. The display substrate according to claim 1, wherein the plurality of stacked inorganic film layers comprise: a barrier layer, the buffer layer, a gate insulator layer, and an interlevel dielectric layer stacked along a direction distal from the base substrate;

wherein the at least one inorganic film layer comprises: the interlevel dielectric layer, the gate insulator layer, and the buffer layer.

5. The display substrate according to claim 1, wherein the plurality of first grooves are equidistantly arranged.

6. The display substrate according to claim 1, wherein the base substrate is a flexible substrate, the bonding region comprises: a first sub-region, a bending region, and a second sub-region which are sequentially distal from the encapsulation region, and a bonding pad in the bonding region is in the second sub-region;

wherein orthographic projections of the two ends of each first groove of the plurality of first grooves on the base substrate have a non-overlapping region with the bending region, and are on a side, proximal to the bending region, of the first sub-region.

7. The display substrate according to claim 1, wherein a distance between a side, proximal to the encapsulation region, of one first groove, proximal to the encapsulation region, of the plurality of first grooves and a side, proximal to the encapsulation region, of the one first groove, most distal from the encapsulation region, of the plurality of first grooves is approximately 60 microns.

8. The display substrate according to claim 1, wherein the display substrate further comprises a barrier dam;

wherein an orthographic projection of the organic layer on the base substrate has a non-overlapping region with an orthographic projection of the barrier dam on the base substrate.

9. A method for manufacturing a display substrate, comprising:

providing a base substrate, wherein the base substrate is provided with an encapsulation region and an edge region on a periphery of the encapsulation region, the encapsulation region comprises a display region and a peripheral region surrounding the display region, and the edge region comprises a bonding region on at least one side of the base substrate;

forming a plurality of stacked inorganic film layers on a side of the base substrate from an inorganic material;

forming a plurality of first grooves which are spaced apart from each other and extend along a periphery of the base substrate on the edge region in a direction distal from the encapsulation region, wherein the plurality of first grooves run through at least one inorganic film layer of the plurality of stacked inorganic film layers, and orthographic projections of the plurality of first grooves on the base substrate have a non-overlapping region with the bonding region, and distances between the plurality of first grooves and the display region are larger than distances between the plurality of first grooves and an edge of the base substrate; and forming an organic layer covering the plurality of first grooves from an organic material; and wherein the display substrate is display substrate according to claim 1.

10. A display device, comprising the display substrate as defined in claim 1.

11. A display substrate, comprising:

a base substrate with an encapsulation region and an edge region on a periphery of the encapsulation region, wherein the encapsulation region comprises a display region and a peripheral region surrounding the display region, and the edge region comprises a bonding region on at least one side of the base substrate;

a plurality of stacked inorganic film layers on a side of the base substrate;

a plurality of first grooves, at the edge region, spaced apart from each other in a direction distal from the encapsulation region, and extending along a periphery of the base substrate, wherein the plurality of first grooves run through at least one inorganic film layer of the plurality of stacked inorganic film layers, and orthographic projections of the plurality of first grooves on the base substrate have a non-overlapping region with the bonding region, and distances between the plurality of first grooves and the display region are larger than distances between the plurality of first grooves and an edge of the base substrate; and an organic layer, covering the plurality of first grooves; wherein the at least one inorganic film layer between each two of adjacent first grooves forms a barrier portion; the plurality of stacked inorganic film layers further comprise a buffer layer comprising a first buffer pattern and a second buffer pattern;

wherein an orthographic projection of the first buffer pattern on the base substrate covers the encapsulation region and a part of the edge region, the second buffer pattern is in the edge region, a thickness of the first buffer pattern is greater than a thickness of the second buffer pattern, and a direction of the thickness of the first buffer pattern and a direction of the thickness of the second buffer pattern are both vertical to a bearing surface of the base substrate; and wherein an orthographic projection of the organic layer on the buffer layer partially overlaps the second buffer pattern, and an orthographic projection of a side, distal from the encapsulation region, of the barrier portion, most distal from the encapsulation region, on the buffer layer overlaps a border line of the first buffer pattern and the second buffer pattern.

12. A display substrate, comprising:

a base substrate with an encapsulation region and an edge region on a periphery of the encapsulation region, wherein the encapsulation region comprises a display region and a peripheral region surrounding the display region, and the edge region comprises a bonding region on at least one side of the base substrate;

a plurality of stacked inorganic film layers on a side of the base substrate;

a plurality of first grooves, at the edge region, spaced apart from each other in a direction distal from the encapsulation region, and extending along a periphery of the base substrate, wherein the plurality of first grooves run through at least one inorganic film layer of the plurality of stacked inorganic film layers, and orthographic projections of the plurality of first grooves on the base substrate have a non-overlapping region with the bonding region, and distances between the plurality of first grooves and the display region are larger than distances between the plurality of first grooves and an edge of the base substrate; and an organic layer, covering the plurality of first grooves; wherein an orthographic projection of each first groove on the base substrate is of an annular shape with an opening;

wherein the annular shape surrounds the encapsulation region, and an orthographic projection of the opening on the base substrate overlaps the bonding region; and wherein the plurality of stacked inorganic film layers further comprise a buffer layer comprising a first buffer pattern and a second buffer pattern.

13. The display substrate according to claim 12, wherein a shape of a side, distal from the bonding region, of the annular shape matches a shape of a side, distal from the bonding region, of the display region.

14. The display substrate according to claim 12, wherein the annular shape comprises: a first side edge, a second side edge, a third side edge, and a fourth side edge which are connected to each other; wherein a distance between the first side edge and a side, distal from the display region, of the peripheral region is equal to a distance between the third side edge and a side, distal from the display region, of the peripheral region;

a distance between an intersection of the first side edge and the second side edge, and a side, distal from the display region, of the peripheral region is less than a distance between an intersection of the first side edge and the fourth side edge, and a side, distal from the display region, of the peripheral region;

a distance between an intersection of the third side edge and the second side edge, and a side, distal from the display region, of the peripheral region is less than a distance between an intersection of the third side edge and the fourth side edge, and a side, distal from the display region, of the peripheral region; and the first side edge and the third side edge are oppositely arranged, the second side edge and the fourth side edge are oppositely arranged, the fourth side edge is disposed on a side where the bonding region is disposed, and the fourth side edge is provided with the opening.

15. The display substrate according to claim 14, wherein at least one angle, of angles formed by each two of adjacent side edges of the first side edge, the second side edge, the third side edge and the fourth side edge of the annular shape is a fillet.

16. The display substrate according to claim 14, wherein the fourth side edge comprises a first portion and a second portion which are separated by the opening;

wherein an angle formed by the first side edge and the first portion, and an angle formed by the third side edge and the second portion are greater than or approximately equal to 90 degrees, but smaller than 180 degrees.

17. The display substrate according to claim 12, wherein a distance between each part of the annular shape and the edge of the base substrate is equal.

18. The display substrate according to claim 12, wherein the bonding region comprises a wiring fanout region and a bonding pad, the bonding pad overlapping the opening;

wherein two ends of each first groove of the plurality of first grooves are on the edge of a side, near a side of the bonding region, of the base substrate, and a distance between each first groove of the two ends of each the plurality of first grooves and the bonding pad is approximately 5 to 10 microns.

19. The display substrate according to claim 12, wherein the annular shape is surrounded by at least one shape of a strip shape and an arc shape.

* * * * *